United States Patent [19]
Eaton, Jr.

[11] Patent Number: 4,873,664
[45] Date of Patent: Oct. 10, 1989

[54] SELF RESTORING FERROELECTRIC MEMORY

[75] Inventor: S. Sheffield Eaton, Jr., Colorado Springs, Colo.

[73] Assignee: Ramtron Corporation, Colorado Springs, Colo.

[21] Appl. No.: 13,746

[22] Filed: Feb. 12, 1987

[51] Int. Cl.[4] .................. G11C 7/00; G11C 11/22
[52] U.S. Cl. ................... 365/145; 365/149; 365/189.01; 365/222
[58] Field of Search ............... 365/145, 149, 189, 222, 365/207

[56] References Cited

U.S. PATENT DOCUMENTS

| | | | |
|---|---|---|---|
| 3,393,346 | 7/1968 | Lechner et al. | 315/166 |
| 3,401,378 | 9/1968 | Bartlett et al. | 340/173.2 |
| 3,422,400 | 1/1969 | Corijnen | 365/145 |
| 3,681,765 | 8/1972 | Chapman | 340/173.2 |
| 3,832,700 | 8/1974 | Wu et al. | 365/174 X |
| 4,161,038 | 7/1979 | Wu | 365/145 |
| 4,164,751 | 8/1979 | Tasch | 357/41 |
| 4,195,355 | 3/1980 | Rohrer | 365/145 |
| 4,408,303 | 10/1983 | Guterman et al. | 365/205 |
| 4,491,936 | 1/1985 | Eaton, Jr. et al. | 365/149 |
| 4,498,154 | 2/1985 | Hoffmann | 365/149 |
| 4,536,785 | 8/1985 | Gibbons | 357/54 |

FOREIGN PATENT DOCUMENTS

| | | | |
|---|---|---|---|
| 594910 | 3/1960 | Canada | 365/145 |
| 8604447 | 7/1986 | European Pat. Off. | 365/145 |
| 533328 | 9/1955 | Italy | 365/145 |
| 534535 | 10/1955 | Italy | 365/145 |
| 829210 | 3/1960 | United Kingdom | 365/145 |

OTHER PUBLICATIONS

Kaufman, "An Expandable Ferroelectric Random Access Memory," *IEEE Trans. on Computers* (1973) pp. 154–158.
Pulvari, "Research on the Application of Ferro-and Ferrielectric Phenomena In Computer Devices" (1963) RTD Tech. Doc. Rept RTD-TDR-63-4002.
Mer 2, *Bell Laboratories Record* (1955) pp. 335–342, "Ferroelectric Storage Devices".

*Primary Examiner*—James W. Moffitt
*Assistant Examiner*—Alyssa H. Bowler
*Attorney, Agent, or Firm*—Edward D. Manzo

[57] ABSTRACT

A semiconductor memory uses cells with a ferroelectric capacitor having one plate coupled to a bit line by a FET and another plate coupled to a plate line. A pulse on the plate line causes the bit line to change voltage based on the state of the cell. A dummy cell arrangement is disclosed using one capacitor per cell, and another embodiment uses two capacitors per cell with no dummy. The cells cooperate with a sense amplifier and timing signals so that they are self restoring.

29 Claims, 5 Drawing Sheets

SELF RESTORING FERROELECTRIC MEMORY

BACKGROUND OF THE INVENTION

The present invention relates to improved arrangements for a ferroelectric memory.

Various ferroelectric materials are known, such as Phase III potassium nitrate, bismuth titanate and the PZT family of lead zirconate and titanate compounds, for example. One characteristic of such materials is a hysteresis curve or loop of the sort illustrated in FIG. 1 wherein the abscissa represents the field voltage applied to the material and the ordinate represents the polarization of the material. That is, because of the hysteresis curve, if a capacitor is formed using a ferroelectric material between its plates, the flow of current through the capacitor will depend on the prior history of the voltages applied to the device. Briefly, if a ferroelectric capacitor is in an initial state wherein zero volts is applied, it may have a polarization indicated at point A in FIG. 1, illustratively. A physical characteristic of the device will be its so called "coercive voltage" represented by a broken line B. If a positive voltage greater than the coercive voltage B is applied across the capacitor, then the capacitor will conduct current and move to a new polarization represented by point C. When the voltage is brought to zero, rather than returning to the polarization represented at A, the ferroelectric capacitor instead will maintain essentially the same polarization, as indicated at point D. A further positive voltage will cause relatively little change in the polarization, moving it toward or beyond point C. However, a substantial enough negative voltage will cause the polarization to vary as represented by point E. Thereafter, when such negative voltage is removed from the capacitor, the polarization of the device remains essentially the same and moves to point A. Thus, points A and D represent two states occurring at zero volts applied across the capacitor but depending on the history of voltage applied to the device.

Consequently, a ferroelectric capacitor is usable as part of a memory cell. Point A can represent a logic "zero," and point D can represent a logic "one." Typically, a ferroelectric capacitor has metallic or conductive plates typically 500 angstroms to 100 micrometers apart with a ferroelectric material such as potassium nitrate as the dielectric between the plates. See, for example, Rohrer U.S. Pat. Nos. 3,728,694 ("Thin Film Ferroelectric Device") issued Apr. 17, 1973; 4,195,355 ("Process For Manufacturing A Ferroelectric Device And Devices Manufactured Thereby") issued Mar. 25, 1980; and 3,939,292 ("Process For Stable Phase III Potassium Nitrate And Articles Prepared Therefrom") issued Feb. 17, 1976, all of whose disclosures are hereby incorporated herein.

To determine the state of a ferroelectric capacitor, one can apply a voltage pulse, observe the current which flows and thereby determine the state. To write into a ferroelectric capacitor cell, one applies a positive or negative voltage to the plates of the capacitor, causing the ferroelectric material therewithin to move along its hysteresis curve as shown in FIG. 1, forcing it into a stable state corresponding to the data, a binary one or a binary zero. To read, if a positive pulse is applied and there is relatively little current drawn or charge moved by the capacitor, then this would indicate that the capacitor was in state D. If substantial charge moved, this would indicate that the capacitor was in state A.

It will be appreciated that if a read operation occurs and a significant amount of charge moves to cause the capacitor to move from one stable state to the other along the hysteresis curve, then the data within the cell will be flipped, as the cell will have moved to the opposite stable state which represents the opposite binary digit. Consequently, restoration is usually needed when reading a memory cell using a ferroelectric capacitor as the memory element.

The prior art has used ferroelectric capacitors as memory cells, and it has been the standard practice to provide an orthogonal arrangement of rows and columns with a memory cell coupling each row to each column at the plural intersections. FIG. 2 represents such a prior art arrangement with nine memory cells arranged in three columns C0, C1 and C2 intersecting three rows R0, R1 and R2. Each intersection has a corresponding ferroelectric capacitor representing a memory cell, and it is noted that each row conductor is connected directly to one of the capacitor plates while each column conductor is connected directly to the other capacitor plates. It will be assumed that the coercive voltage of the ferroelectric capacitors is between three and four volts. To select a memory cell 10, a positive voltage (illustratively 5 volts) is applied to row R0 and thus to the top capacitor plates of capacitors 10, 12 and 14. Zero volts is applied to the other rows R1 and R2. Also, zero volts is applied to the column C0 (and hence the bottom plate of capacitor 10), so that the voltage across capacitor 10 is five volts. The amount of current which flows indicates the data stored in capacitor 10. To prevent reading the other cells of the array, the voltage across capacitor 16 is controlled to be zero volts, which is less than the coercive voltage. Hence, capacitor 16 does not change state. However, if zero volts is applied to column C1 or C2, then the voltage across capacitors 12 and 14 in row R0 will be five volts, which exceeds the coercive voltage. Thus, all cells 10, 12, and 14 in row R0 would be accessed. To prevent this, columns C1 and C2 are controlled to have one-half of the full read voltage applied to them. Thus, 2.5 volts is applied to columns C1 and C2, so that the total voltage across capacitors 12 and 14 each is only 2.5 volts. Because 2.5 volts is less than the coercive voltage, those cells ought to remain in the stable state in which they started. Thus, only cell 10 at the intersection of row R0 and column C0 can be accessed for reading in this manner.

Having read memory cell 10, one ordinarily must restore it back to its original stable state. To do this, five volts is placed on column C0 and zero volts on row R0. Each of rows R1 and R2 are brought to 2.5 volts, and columns C1 and C2 are brought to zero volts.

Circuitry able to accommodate these sequences of voltage combinations is complex, impedes the objective of achieving high speed in the memory, and takes space. One object of the present invention therefore is to provide a simpler design or arrangement for ferroelectric capacitor memory cells which will overcome this need for elaborate circuitry for switching rows and columns among various voltage combinations in order to read and restore the memory cells.

Another problem associated with prior art ferroelectric memories is a "disturb signal." Most, if not all, ferroelectrics have a coercive voltage, i.e., a small voltage applied to the capacitor for a long enough time can cause the capacitor to change state. For example, if a ferroelectric capacitor in state A (FIG. 1) has a voltage of 2.5 volts applied across it for a long enough time, then even though the coercive voltage may be between three and four volts, the capacitor may move to state D. A further object of the present invention is to reduce these "disturb voltage" or "disturb signal" effects.

A third problem addressed by the present invention is that it has traditionally been thought that if a ferroelectric material has no clear coercive voltage, then it is not usable in a memory. This problem also is overcome by the present invention.

SUMMARY OF THE INVENTION

According to various aspects of the present invention, a memory cell is formed wherein a ferroelectric capacitor is coupled to a bit line via a transistor. Preferably, the bit line is coupled by the source-drain path of a field effect transistor to one plate of the ferroelectric capacitor. The other capacitor plate is accessed by a "plate" line. The transistor is gated by a word line. According to this arrangement, when a pulse, such as a square wave one-shot, is applied to the plate line, the bit line associated with the ferroelectric capacitor will change voltage in proportion to the state of the memory cell, i.e., the state of a capacitor.

Such a memory cell can then be combined, according to another aspect of the invention, with a sense amplifier and dummy memory cell arrangement wherein a complementary pair of bit lines is coupled to a sense amplifier. The dummy memory cell is coupled to one side of the sense amplifier and an operational memory cell is coupled to the other side. Preferably, the dummy cell, formed by combining a transistor and a ferroelectric capacitor, will have a dummy word line and a dummy plate line. The operational memory cell will also have a word line and a plate line. Illustratively, the dummy memory cell will have greater capacitance than the operational memory cell.

To read the data using this configuration, preferably the bit lines are precharged to zero volts. Next, the word line, plate line, dummy word line and dummy plate line are all raised to a pre-selected voltage. The capacitor in the operational memory cell is coupled to its bit line through its access transistor, and the dummy memory cell capacitor is coupled to the complementary bit line via its transistor. If the data stored in the memory cell is a logic one, then the dummy memory cell capacitor will cause the voltage on the complementary bit line to increase more than the voltage increase on the bit line because it has a larger capacitor than that of the operational memory cell. If, on the other hand, a logic zero is present in the operational memory cell, then the bit line will rise in voltage faster than the voltage rise on the complementary bit line. The sense amplifier will sense whichever one of the bit lines rises in voltage faster and will drive the bit line to one of two states, in accordance with traditional operation of sense amplifiers. Thereafter, when the voltage on the plate line is removed, the voltage impressed on the bit line pair by the sense amplifier restores the capacitor of the operational memory cell to the proper state. Hence, this embodiment of the invention uses a bit line, word line, and plate line for an operational ferroelectric cell and a dummy ferroelectric cell.

In the first embodiment the dummy cell has greater capacitance than the operational memory cell. A modification can be made so that, for example, the dummy cell and the operational cell are the same size, but the dummy cell would be charged to one-half the charge of the operational cell. Or, the dummy cell could have one-half the capacity and be charged to the same voltage as the operational cell.

A second embodiment of the invention uses no dummy memory cell per se, but does include two ferroelectric capacitors for each memory cell. The two capacitors of each cell store complementary data. Respective access transistors gated by the same word line couple the capacitors of the cell to corresponding parts of a bit line pair which is coupled to a sense amplifier. One set of plates of the capacitors is coupled to a plate line. When the word line and plate line are raised to a preselected voltage, both memory cell capacitors are coupled to their respective bit lines. During a read or write, the sense amplifier senses the voltage difference between the bit lines and drives the bit lines to one of two states depending upon the memory cell state. When the preselected voltage on the plate line is removed, the voltage impressed on the bit lines by the sense amplifier writes or restores the correct state to each memory cell capacitor.

Preferably the memory cells are arranged along rows and columns, each column having a bit line pair. In one configuration, the rows include a word line coupled to the gate electrodes of the access transistors of each cell. The plate line illustratively is separate from the word line but parallel to it. In a second configuration, the plate line extends perpendicular to the word line. This provides the advantage that only one cell out of an entire matrix of cells is selected. These combinations provide a ferroelectric memory which is self-restoring and provides numerous advantages.

DETAILED DESCRIPTION OF THE PREFERRED EMBODIMENT

Figure 3:
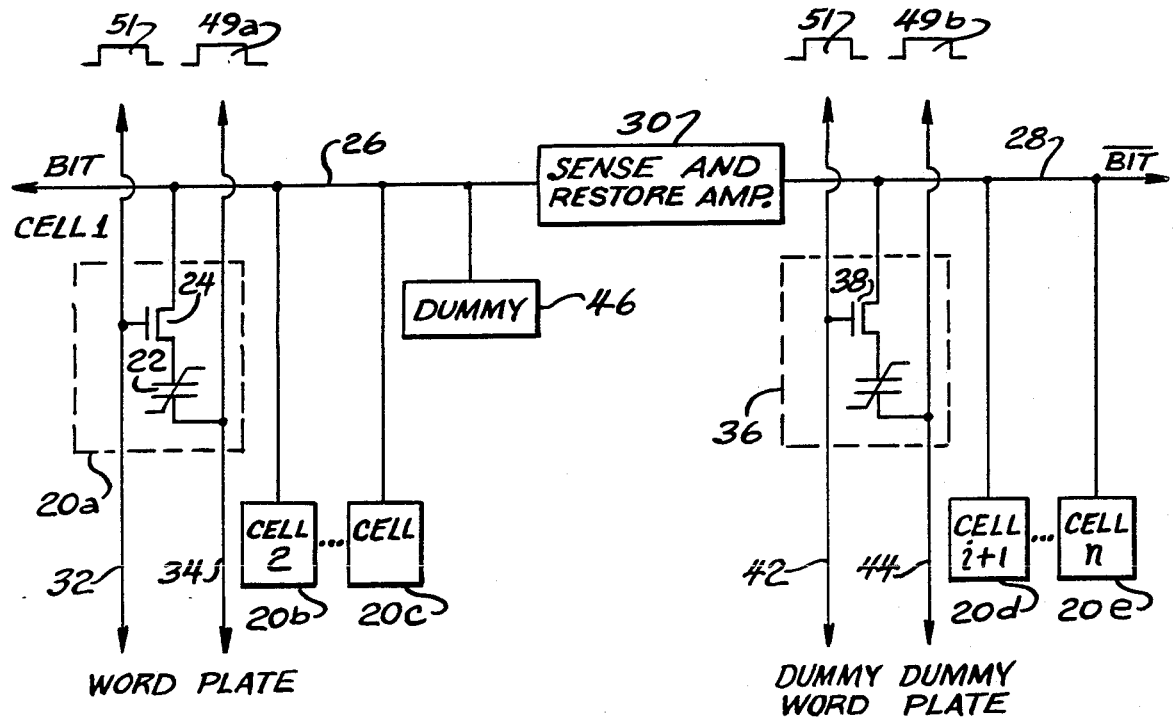
FIG. 3 illustrates a first embodiment of the present invention wherein ferroelectric memory cells cooperate with a sense amplifier, dummy memory cells access transistors, a pair of bit lines, and a controlled plate line.

FIG. 3 illustrates a portion of a memory array according to various aspects of the present invention. A memory cell 20a (sometimes referred to as an "operational" memory cell to distinguish it from a "dummy" memory cell described infra) indicated in broken lines comprises a ferroelectric capacitor 22 and an access transistor 24. Capacitor 22 is indicated with a symbol for a ferroelectric capacitor and includes a pair of spaced apart capacitor plates with a ferroelectric dielectric between them. The Rohrer patents mentioned supra describe illustrative ferroelectric capacitors suitable for use here. One plate of capacitor 22 is coupled to transistor 24. Illustratively, transistor 24 is an n-type field effect type transistor illustratively of the enhancement type used herein as a switching device. Preferably, the source-drain path of transistor 24 couples one plate of capacitor 22 to a bit line 26. A complementary bit line 28 is associated with bit line 26, and both are coupled to a sense and restore amplifier 30.

Memory cell 20a is also coupled to a word line 32 and a plate line 34. Specifically, the gate electrode of transistor 24 is coupled to word line 32, and the other plate of capacitor 22 is coupled to plate line 34. Illustratively, word line 32 and plate line 34 are parallel in FIG. 3 and are parallel in the physical configuration of a memory array according to this embodiment of the invention.

A "dummy" memory cell 36 is coupled to complementary bit line 28 and, like operational memory cell 20a includes an access transistor 28 and a ferroelectric capacitor 40. These are coupled in like fashion to a dummy word line 42 and a dummy plate line 44. According to this embodiment of the invention, to achieve the desired operation of sense amplifier 30, the capacity of capacitor 40 in dummy cell 36 will be greater than the capacity of capacitor 22, and preferably capacitor 40 is at least two times as large as capacitor 22.

It will be noted that the present configuration contemplates a total of n memory cells coupled to amplifier 30. Of these, i memory cells 20a, 20b, 20c are coupled to bit line 26 and the remaining memory cells 20d, 20e are coupled to complementary bit line 28. Moreover, a second dummy cell 46 is coupled to bit line 26.

It will be understood that the connections have been drawn in detail only for memory cell 20a and dummy cell 36, and that the remaining memory cells 20b, 20c, 20d, 20e and 46 have been illustrated in a simplified or representative fashion. It will be understood, however, that each of memory cells 20 is constructed, configured and coupled like memory cell 20a, and that dummy cell 46 is constructed, configured and coupled in the same way as dummy cell 36.

This embodiment of the present invention will have a logic one written into the dummy cell during an initialization cycle following power-up. Memory cell 20a will contain stored data which is to be read out. Appropriate decoding circuitry (shown illustratively in FIG. 8) will decode address information provided to the memory chip and will identify memory cell 20a. Because dummy cell 36 is on the right side of the sense amp 30, it corresponds to and acts as the dummy cell for any of memory cells on the left side, viz. 20a, 20b, 20c. Bit lines 26, 28 will have been precharged to zero volts. For the further initial condition, it may be assumed that a logic one is stored in memory cell 20a. Returning to FIG. 1, state A represents logic zero and state D represents a logic one. Thus, memory cell 20a will have its capacitor 22 at state D. Dummy cell 36 also will have its capacitor 40 at state D.

A one-shot pulse 49 is then applied to plate line 34, and a one-shot pulse T49b is applied to dummy plate line 44. Another one shot pulse 51 is applied to word lines 32 and 42. The rising edges of pulses 49a, 49b, and 51 are simultaneous, and the pulses impress a voltage, illustratively five volts, across capacitors 22, 40 and turn on transistors 24 and 38. Because capacitor 22 is at state D, relatively little current will flow therethrough as it moves up the hysteresis curve to point C. Capacitor 40 in dummy cell 36 is at the same state D, the five volts applied across capacitor 40 will also result in some charge flow as the ferroelectric material therein moves from state D to point C. However, because the capacitance of capacitor 40 exceeds that of capacitor 22, capacitor 40 draws more current than capacitor 22. As a result, the voltage on the complementary bit line 28 increases more than the voltage increase on bit line 26. Amplifier 30, turned on by an appropriate signal described infra, senses this differential and drives bit line 26 to a logic zero (such as zero volts) and complementary bit line 28 to a logic one (such as positive five volts). This condition of the bit lines can be further amplified by driver amplifiers and provides the data output. It can be observed that capacitor 22 started in state D and remained there during the sensing operation. Next, the trailing edge of pulse 49a occurs before the trailing edge of pulse 51. This means that the bottom plate of capacitor 22 will have zero volts on it (from plate line 34). Even though capacitor 22 will remain coupled to bit line 26 for a short time thereafter, line 26 is also at zero volts as a result of the sense operation. Consequently, with zero volts across capacitor 22, no state change occurs. Thus it is seen that if cell 20a stores a logic one, no state change occurs to its capacitor and no restoration is required for it.

If memory cell 20a stored a logic zero rather than a logic one, then even though the timing of signals remains the same, a different sequence of events transpires. This is because when plate line 34 is pulsed with a positive pulse (49a), the ferroelectric material in capacitor 22 will undergo a state change from state A to state D and thereby move more charge than capacitor 40. (Recall that capacitor 40 begins at state D from the initialization.) Hence, bit line 26 will be driven high and complementary bit line 28 will be driven low by sense amp 30 as a result of the voltage difference caused by the two memory cells 20a and 40. When the voltage on plate line 34 is returned to low, with word line 32 still high (because the trailing edge of pulse 51 lags behind the trailing edge of pulse 49a), the combination of a high voltage on the top plate of capacitor 22 (coupled from bit line 26 via the source-drain path of transistor 24) together with a low voltage on the bottom plate (coupled by plate line 34) restores the ferroelectric material of capacitor 22 to its original condition, state A, representing a logic zero.

In short, by using this dummy cell arrangement, if a logic one is stored in the operational memory cell, no state change even occurs to that cell by a read operation. If a logic zero is stored, the cell is flipped during sensing but automatically restored by dropping the plate line low while leaving the capacitor coupled briefly to the bit line.

It will be noted that pulse 49b has the same timing as pulses 51, i.e. has coincident rising and trailing edges. This prevents dummy cell capacitor 40 from changing state during sense or restore.

In the event that the addressed memory cell is on the right side of sense amp 30, then dummy cell 46 is used rather than dummy cell 40.

Figure 4:
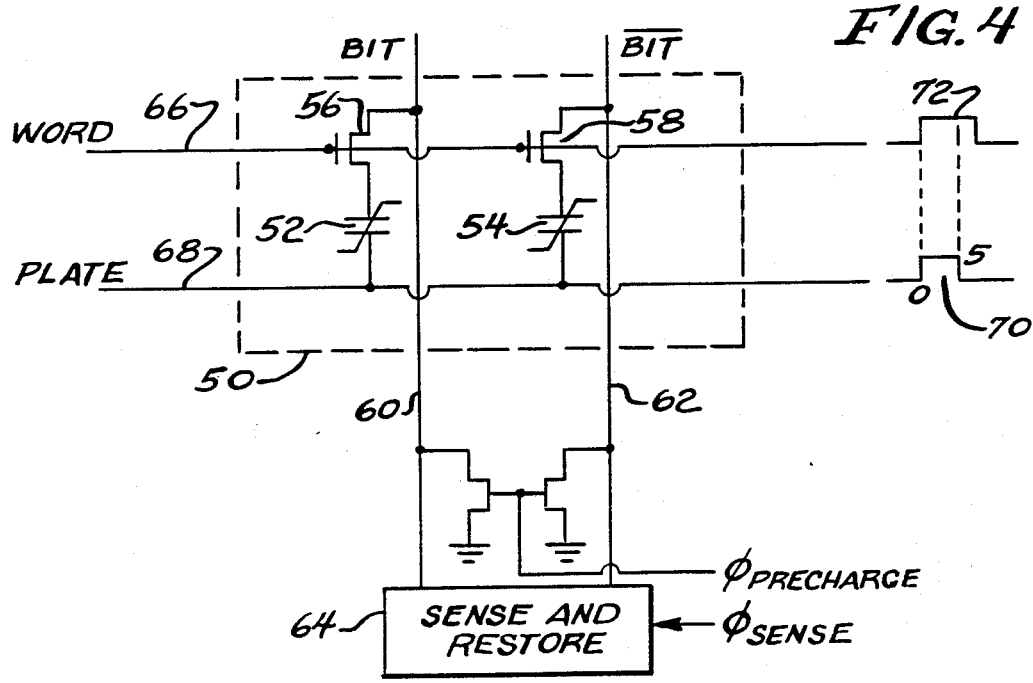
FIG. 4 illustrates a second embodiment of a memory according to the present invention using two ferroelectric capacitors per memory cell but no dummy cell.

FIG. 4 illustrates a memory cell 50 according to a second embodiment of the present invention. Memory cell 50 will store complementary binary data in a pair of ferroelectric capacitors 52, 54 each respectively coupled by source-drain paths of respective access transistors 56, 58 to a pair of bit lines 60, 62 both coupled to a sense and restore amplifier 64. A word line 66 is coupled to the gate electrodes of transistors 56, 58. A plate line 68 is coupled illustratively to the bottom plates of both capacitors 52, 54. It will be seen that plate line 68 is parallel to word line 66 in the schematic diagram. This occurs also in the physical layout of such a configuration wherein the word line 66 physically will be parallel to the plate line 68.

Figure 1:
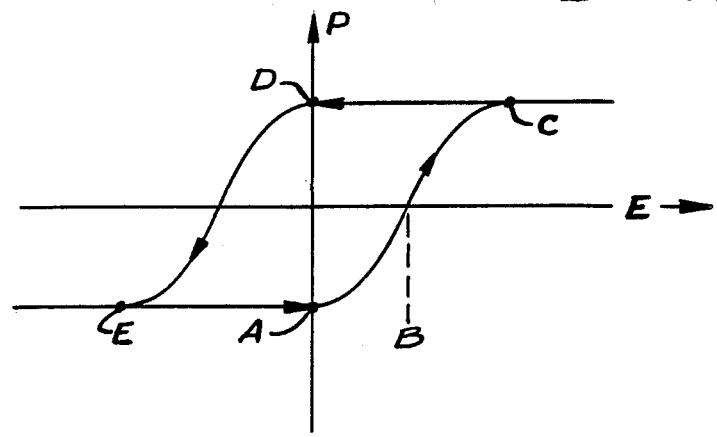
FIG. 1 represents a hysteresis curve for a ferroelectric material.
Figure 2:
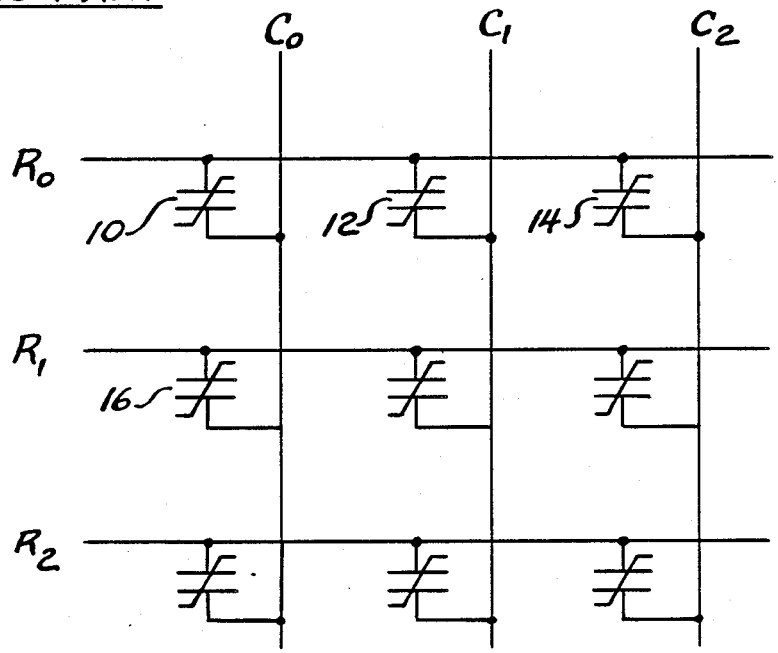
FIG. 2 represents a prior art type of array using one ferroelectric capacitor per memory cell.

If the binary data to be stored is a logic "one," then capacitor 52 will be in one state and capacitor 54 will be in the other state, whereas if the binary data is low, then the capacitors will be in the opposite states. In any event, the capacitors will be in complementary states. Assume the data is a logic one and that capacitor 52 illustratively is at state D (FIG. 1). Hence, according to this aspect of the present invention, capacitor 54 will be at state A representing a logic zero. The initial voltage on plate line 68 will be zero, and the initial voltage on bit lines 60, 62 will be zero. Accordingly, because no voltages are applied across the capacitors, there is no leakage.

To select memory cell 50 and sense its stored data, a positive pulse of illustratively five volts, as represented at 70, is applied to plate line 68. Thus, the voltage at the bottom plates of capacitors 52 and 54 is brought to five volts. Also, the word line voltage is brought to five volts illustratively by a pulse 72. Pulses 70, 72 have coincident rising edges but pulse 72 endures longer, so that its trailing edge lags the trailing edge of pulse 70. It will be convenient to decode both the plate line and word line together. (At the end of the cycle, the plate line is dropped first, then the word line, and then both bit lines are precharged to zero.)

As a result of pulses 70, 72 going high, transistors 56, 58 are turned on and a voltage of five volts is applied across both capacitors 52 and 54. Capacitor 52, it will be recalled, is in state D, and when the positive five volts is applied across it, relatively little charge flows as the polarization of the ferroelectric material moves illustratively to point C. However, as capacitor 54 is initially at state A, when the five volt signal is applied across the capacitor, the coercive voltage is exceeded, and the polarization of the ferroelectric material in the capacitor moves from state A to point C, drawing considerably more charge (and current) than capacitor 52 draws. Bit line 60, coupled to capacitor 52 through the source-drain path of transistor 56, will stay relatively close to zero volts notwithstanding the five volt signal applied to the lower plate of capacitor 52. However, because a significant current flows through capacitor 54 as it changes its polarization from state A to point C, the voltage on bit line 62 rises. Through an appropriate signal referred to as $\phi_{sense}$ (FIG. 7), sense amplifier 64 turns on and detects the difference in voltages between bit lines 60, 62 and drives the higher line, bit line 62, illustratively to plus five volts. It also drives bit line 60 to ground. This condition allows the data to be read via the bit lines.

In this condition, the ferroelectric materials in capacitors 52, 54 are both in state D, unlike their original condition. To restore the original condition, according to another aspect of the invention, the plate line voltage is returned to zero volts while the word line voltage is still high and the bit lines are driven by the sense amplifier 64. This occurs by virtue of the trailing edge of pulse 72 lagging behind the trailing edge of pulse 70. Because the voltage on bit line 62 will be plus five volts, the voltage across capacitor 54 will be substantially five volts which will drive the polarization of the ferroelectric material within capacitor 54 from point C through state D to stable state A, which represents a logic zero.

This is the condition in which capacitor 54 started, and capacitor 54 thus is restored. Capacitor 52, on the other hand, will not change in polarization when pulse 70 terminates because substantially zero volts is applied across it. It will therefore be appreciated that this arrangement entirely restores memory cell 50 to its original condition in a read operation and hence the circuitry is referred to as "self-restoring." After pulse 72 reaches its trailing edge, sense amp 64 is deactivated by the return of the signal $\phi_{sense}$ to zero volts. Next, the bit lines are precharged by shorting the bit lines to ground via the source-drain paths of further transistors and a $\phi_{precharge}$ signal.

Another advantage of this arrangement is that no "disturb" voltage such as 2.5 volts is applied for any duration across a capacitor, and there is no major concern about a memory cell capacitor changing polarization state even though the voltage applied across it does not exceed a coercive voltage. Moreover, it is not necessary to have a well defined coercive voltage in the capacitors 52, 54 of the FIG. 4 configuration. Further, a small hysteresis effect is all that is necessary for this arrangement.

Figure 5:
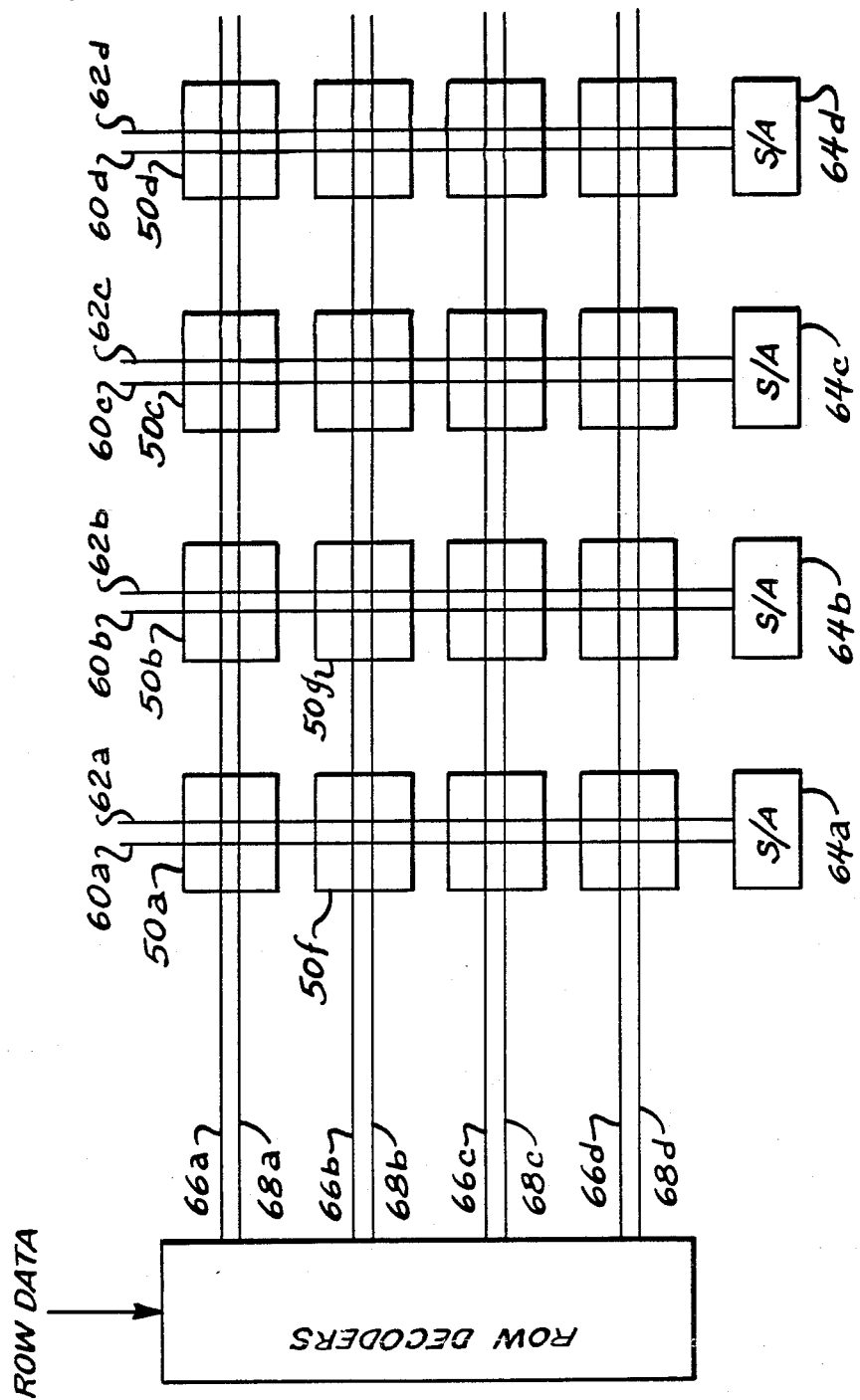
FIG. 5 illustrates a larger portion of a memory array using the FIG. 4 embodiment of the present invention.

Referring to FIG. 5, which illustrates an array of memory cells using the FIG. 4 configuration, it will be appreciated that all memory cells in the row represented by a word line 66a, b or c and plate line 68a, b or c, each having a respective sense amplifier 64a, b, c or d, will be read by this operation because both the word line and plate line 66, 68 voltages will be initially decoded together and create the same conditions across the row. Thus, all of the sense amplifiers 64a, b, c and d will be active when any row is decoded. In FIG. 5, the sense amplifiers are coupled to bit line pairs 60a, 62a; 60b, 62b; 60c, 62c; and 60d, 62d.

Figure 6:
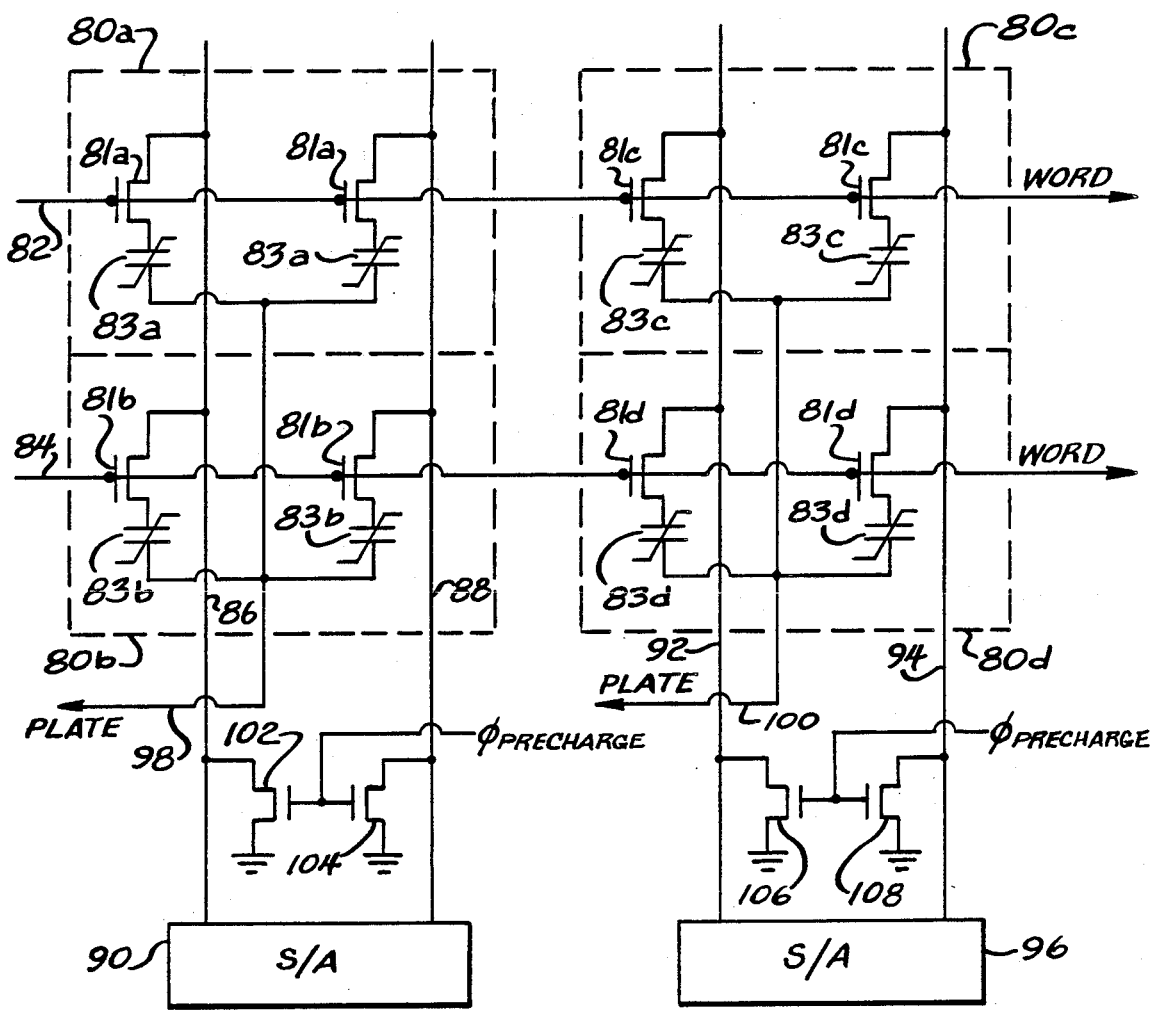
FIG. 6 illustrates an alternate configuration of a circuit according to the present invention.

An alternate embodiment of the present invention overcomes this problem by running plate line 68 perpendicular to word line 66, as illustrated in FIG. 6. Four memory cells are represented as 80a, 80b, 80c and 80d, all of a configuration like that of cell 50 (FIG. 5). Thus, each cell includes transistors 81 (81a, b, c, or d) and ferroelectric capacitors 83 (83 a, b, c, or d). Cells 80a and 80c are in one row, having a word line 82. Cells 80b and 80d are in another row, having a word line 84. Cells 80a and 80b are in a left column and have a common bit line pair 86, 88 coupled to a sense amplifier 90. Cells 80c and 80d in a right column have common bit lines 92, 94 coupled to a sense amplifier 96. A single plate line 98 corresponds to the left column and a single plate line 100 corresponds to the right column, and thus each column has its own respective plate line. In the prior embodiment, each row had its own respective plate line.

This arrangement saves tremendous power because to access cell 80a, for example, only word line 82 and plate line 98 are pulsed with a five volt signal. As a result, only cell 80a, and not cells 80b, 80c or 80d will be accessed. This is because the voltage on word line 82 will turn on all of the access transistors 81a, 81c in the top row, but a plate voltage will be applied to only the two capacitors 83a, 83b in the left column, i.e., applied to cell 80a but not 80c. Thus, cell 80a is accessed in the manner described above. Cell 80b in the second row is not accessed because although a plate voltage is applied to its two capacitors 83b, the capacitors are isolated from the bit lines by the access transistors 81b which will remain in an off condition. Hence, only amplifier 90, and not amplifier 96, will draw significant power in the read operation.

FIG. 6 illustrates precharge circuitry usable in the other figures. It comprises transistors 102, 104, 106, 108 each having its source-drain path coupling bit lines 86, 88, 92, 94 respectively to ground when such transistors are gated to an on condition by a precharge signal $\phi_{precharge}$ coupled to the gate electrodes, as shown.

Figure 7:
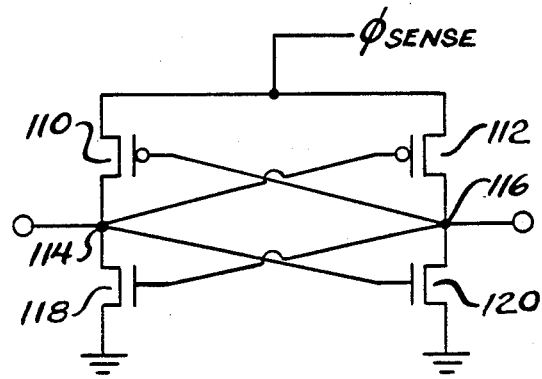
FIG. 7 illustrates a sense amplifier suitable for use in FIGS. 3, 4, 5 or 6.

FIG. 7 illustrates a typical sense amplifier suitable for use as amplifiers 30, 64, 90 or 96. Any differential amplifier or amplifier setting up a "race" condition between two bit lines, as is well known in the semiconductor memory art, can be used, or other types can be employed which sense a greater voltage or current on one of two lines. This embodiment uses a cross coupled pair of p-channel transistors 110, 112 coupling a switched source of operating voltage, $\phi_{sense}$, to nodes 114, 116 respectively. Such nodes are cross coupled also to gate electrodes of n-channel transistors 118, 120 whose source-drain paths couple nodes 114 and 116 respectively to ground. Nodes 114 and 116 are coupled to the bit line pair in use, viz 26 and 28, 60 and 62, 86 and 88, or 92 and 94.

It may be desirable to include a bootstrap driver for the word line to allow the full five volts to appear across the plates of the ferroelectric capacitors. However, if the coercive voltage is low, such as 0-5V, bootstrap drivers should not be needed.

Figure 8:
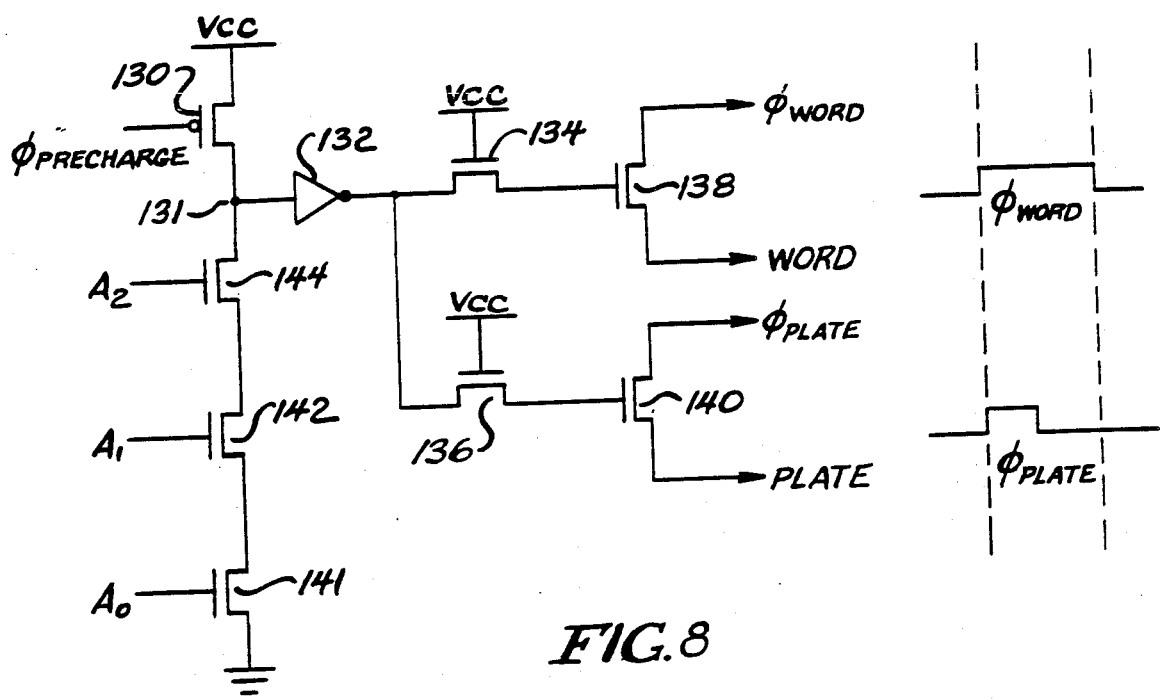
FIG. 8 illustrates decoding circuitry.

FIG. 8 shows a decoder circuit for decoding the $\phi_{word}$ and $\phi_{plate}$ signals common to all word lines and plate lines in a memory to a single word and plate line identified by a unique combination of address data represented in FIG. 8 as $A_0$, $A_1$, $A_2$. A p-channel transistor 130 normally couples a VCC signal to a node 131. An inverter 132 is coupled to receive and invert the signal at node 131 and apply it to source-drain paths of n-channel transistors 134 and 136. Transistor 134 is coupled to the gate electrode of a transistor 138 whose source is coupled to the $\phi_{word}$ signal. The drain is coupled to drive a word line, such as word line 32 (FIG. 3). Similarly, transistor 136 gates a transistor 140 having a source coupled to the plate signal $\phi_{plate}$ and a drain coupled to drive a plate line, such as plate line 34.

Having described how to read with the present invention, the write process can be readily understood. A data-in buffer (commonly used in present dynamic and static RAMS) couples the bit lines to the data-in input. The sense amplifier will latch the state to be written when $\phi_{sense}$ rises, which causes data to be written into the cells.

The arrangement of the present invention does not require the capacitors to have a well defined coercive voltage or absolute switching threshold. As long as the ferroelectric has a hysteresis loop with different paths, the present configuration will be useable. Additionally, no disturb pulse will destroy the data in a cell because even if the disturb pulse activated one of the capacitors to change its polarization, the self-restoring nature of this configuration would return the cell to its original condition.

It should also be noted that it is not necessary for data to be written to opposite extremes on the hysteresis loop of FIG. 1. A logic zero can occur at zero volts with a polarization value between points A and D of FIG. 1. Such a level is written by applying a short high voltage. pulse to the capacitor so that it has inadequate time to travel up the entire loop from a normal logic zero state (point A). This kind of partial hysteresis loop switching increases speed since the entire loop need not be traversed.

I claim:

1. In a nonvolatile ferroelectric memory of the type having a plurality of memory cells arranged in rows and columns, each column comprising a bit line coupled to memory cells along the column, each said memory cell comprising a ferroelectric capacitor having first and second plate electrodes, the polarization of said capacitors corresponding to the data stored therewithin, the improvement wherein:

said memory further comprises a plurality of word lines and a plurality of plate lines distinct from said bit lines and word lines, each of the memory cells along a row being coupled to a word line corresponding to the row, each memory cell being coupled also to a corresponding plate line, each plate line being coupled to plate electrodes in a plurality of said cells, each said memory cell further including a respective switching device located within the memory cell, said first plate electrode of said capacitor in said cell being coupled to its corresponding bit line via said switching device, said switching device being coupled to be controlled by said corresponding word line, said second plate electrode of said capacitor in said cell being coupled to said corresponding plate line.

2. The memory of claim 1 further comprising for each bit line, a respective sense amplifier coupled to said bit line and a dummy ferroelectric memory cell coupled to said sense amplifier, said dummy cell including therewithin a second switching device and a second ferroelectric capacitor, said capacitor having first and second plate electrodes, said first plate electrode being coupled via said second switching device to said sense amplifier, and a second plate line coupled to said second plate electrode of said second capacitor.

3. The memory of claim 2 wherein said first and second switching devices comprise field effect transistors each having gate electrodes coupled respectively to said word line and a second word line.

4. The memory of claim 1 wherein said switching device comprises a field effect transistor having a gate electrode coupled to be controlled by said word line.

5. The improvement of claim 1 further including a decoder, and wherein said plate line is further coupled to said decoder.

6. A nonvolatile ferroelectric memory comprising a plurality of ferroelectric memory cells arranged in rows and columns, each row corresponding to a word line, each column corresponding to first and second complementary, bit lines coupled to a respective sense amplifier, each memory cell comprising first and second ferroelectric capacitors, each said capacitor having first and second plate electrodes, the first plate electrode of said first capacitor coupled selectively to said first bit line and the first plate electrode of said second capacitor coupled selectively to said second bit line;

each said memory cell including first and second access transistors each having a control electrode coupled to said corresponding word line, said first and second transistors being coupled respectively to the first plate electrodes of said first and second ferroelectric capacitors, each said transistor being located within said memory cell, said transistors being selectively actuable to couple said first plate electrodes of said capacitors to said first and second bit lines associated with said memory cell in response to a voltage on said word line;

said sense amplifier being responsive to a difference in voltage between said first and second bit lines;

said memory further including a plate line distinct from said bit lines, coupled to said second plate electrodes of both capacitors in a plurality of memory cells.

7. The memory of claim 6 wherein each said sense amplifier is responsive to a difference in voltages between said first and second bit lines to drive one of said bit lines to a first voltage and to maintain the other bit line at a reference voltage.

8. The memory according to claim 6 wherein said word line is parallel to said plate line.

9. The memory according to claim 6 wherein said word line is perpendicular to at least a portion of said plate line.

10. A nonvolatile ferroelectric memory comprising:
an array of memory cells organized into rows and columns;
a plurality of sense amplifiers, each column including a pair of bit lines coupled to a sense amplifier;
a plurality of word lines and plate lines, each said word line corresponding to a row of memory cells, each plate line being distinct from said word lines and said bit lines and being coupled to a plurality of memory cells;
each memory cell comprising two ferroelectric capacitors coupled to a corresponding plate line, a pair of transistors located within the memory cell and each coupled to said word line and to a respective said bit line, each said capacitor corresponding to a respective said transistor so that said capacitor can be coupled selectively to a corresponding said bit line; and
means for applying a voltage to a selected word line and a selected plate line to polarize one of said capacitors.

11. The memory according to claim 10 wherein said plate lines are parallel to said word lines.

12. The memory according to claim 11 wherein said plate lines are perpendicular to said word lines.

13. A nonvolatile ferroelectric memory comprising an array of memory cells arranged in rows and columns, each said memory cell comprising a pair of capacitors each employing ferroelectric material therein, said columns each including
a pair of complementary bit lines, a pair of transistors responsively coupled to a word line, said transistors being located within each memory cell and operable for coupling said capacitors of said memory cell to a pair of bit lines, and
sensing means coupled to said pair of bit lines, for driving said bit lines in accordance with the data content of said memory cell and for restoring the polarization of said memory cell capacitors.

14. The memory of claim 13 wherein said means coupling comprises switchable semiconductor devices coupled to a source of operating voltage.

15. The memory of claim 13 wherein said sensing means comprises a sense amplifier coupled to maintain a voltage on said bit lines after data from said memory cell has been read thereby to restore one of said capacitors.

16. A method of operating a nonvolatile semiconductor memory comprising the steps of:
storing complementary data in a memory cell having a pair of ferroelectric capacitors, said storing step including polarizing said capacitors in accordance with the data;
coupling said capacitors to a pair of bit lines via a pair of transistors;
applying a first signal across said capacitors until one said capacitor changes polarization, said applying step including controlling the voltage on a plate line distinct from said bit lines and coupled to both of said capacitors;
sensing said change of polarization, and driving said bit line pair in accordance with the data in said cell; and thereafter
restoring said capacitors to their original polarization states by applying a voltage transition via said plate line to said capacitors while said bit lines are in a condition corresponding to the data sensed in the preceding step.

17. A non-volatile ferroelectric memory comprising an array of memory cells arranged in rows and columns, each said row corresponding to a respective word line, each said column corresponding to a respective bit line,
a respective sense amplifier coupled to each said bit line;
each memory cell comprising a ferroelectric capacitor having first and second plate electrodes and a transistor located within said cell for coupling said first electrode of said ferroelectric capacitor to the corresponding said bit line;
said word line being coupled to a control electrode of said transistor; and
a plate line coupled to the second plate electrode of said ferroelectric capacitor, said plate line being coupled to second plate electrodes of a plurality of capacitors in said array, said plate line being distinct from said word lines and said bit lines.

18. The memory of claim 17 further comprising a dummy cell coupled to said sense amplifier.

19. The memory of claim 17 further comprising a second ferroelectric capacitor coupled to said sense amplifier.

20. The memory of claim 17 wherein said transistor control electrode comprises the gate electrode of a field effect transistor.

21. The memory of claim 20 wherein said capacitor comprises a field effect transistor and the source-drain path of said transistor couples said one capacitor electrode to said bit line.

22. The memory of claim 17 further including a decoder and wherein said plate line is coupled to said decoder.

23. A nonvolatile method of reading data from and restoring data to a ferroelectric capacitor in a memory cell selected from an array of memory cells organized into rows and columns, each memory cell in the array including a respective ferroelectric capacitor and a switchable device located in the cell, where two polarization states of a said capacitor at a reference voltage correspond to two binary logic levels, comprising the steps of:
applying a signal to a word line along the row corresponding to the selected memory cell for turning on the switchable device located within the selected memory cell and thereby coupling one plate of said capacitor to a bit line corresponding to the column, and turning on other switchable devices for other cells along the word line in the same step;

applying a non-zero voltage across the plates of said capacitors in a plurality of said cells along the row while said switchable devices in said cells are turned on;

comparing the signal developed on a bit line corresponding to the selected memory cell to another signal thereby to determine the logic state of the data and terminating the nonzero voltage and the word line signal at different times.

24. The method of claim 23 further comprising applying a low voltage and a high voltage in a sequence to another plate of said ferroelectric capacitor while said switchable device is turned on, thereby restoring said capacitor to the polarization state prior to the read operation regardless of the logic state.

25. The method of claim 23 wherein said step of applying a non-zero voltage comprises applying a pulse to the other plate of said capacitor, said pulse terminating at a first trailing edge, said switchable device remaining turned on after said first trailing edge, and wherein said bit line is driven to a voltage level corresponding to the data read from said capacitor thereby to restore a ferroelectric polarization state to said capacitor.

26. The method of claim 25 wherein said steps of turning on a switchable device and applying a non-zero voltage commence simultaneously.

27. The method of claim 23 wherein said steps of turning on a switchable device and applying a non-zero voltage commence simultaneously.

28. The method of claim 23 wherein said comparing step comprises comparing said signal to another signal developed from a second ferroelectric capacitor.

29. The method of claim 28 wherein said comparing step includes operating a sense amplifier having one input coupled to said bit line, and having another input coupled to a second bit line which is coupled to said second ferroelectric capacitor.

* * * * *

UNITED STATES PATENT AND TRADEMARK OFFICE
CERTIFICATE OF CORRECTION

PATENT NO. : 4,873,664

DATED : October, 10, 1989

INVENTOR(S) : S. Sheffield Eaton, Jr.

It is certified that error appears in the above-identified patent and that said Letters Patent is hereby corrected as shown below:

Column 11, lines 59-60, Claim 14, change "means coupling comprises switchable semiconductor devices" to -- transistors are --.

Col. 11, Claim 12, line 1, change "11" to --10--.

Col. 12, Claim 21, line 1, change "capacitor" to --transistor--, and line 3, change "one" to --first--.

Signed and Sealed this

Twenty-ninth Day of September, 1992

Attest:

DOUGLAS B. COMER

*Attesting Officer*   *Acting Commissioner of Patents and Trademarks*